(12) United States Patent
Davis

(10) Patent No.: US 6,909,150 B2
(45) Date of Patent: Jun. 21, 2005

(54) MIXED SIGNAL INTEGRATED CIRCUIT WITH IMPROVED ISOLATION

(75) Inventor: Paul C. Davis, Reading, PA (US)

(73) Assignee: Agere Systems Inc., Allentown, PA (US)

( * ) Notice: Subject to any disclaimer, the term of this patent is extended or adjusted under 35 U.S.C. 154(b) by 51 days.

(21) Appl. No.: 09/911,035

(22) Filed: Jul. 23, 2001

(65) Prior Publication Data

US 2003/0015759 A1 Jan. 23, 2003

(51) Int. Cl.[7] .............................................. H01L 29/76
(52) U.S. Cl. ...................... 257/368; 257/370; 257/506; 257/508; 257/544; 257/547; 257/372
(58) Field of Search ................................. 257/312, 313, 257/347, 357, 506, 516, 535, 547, 508, 509, 505, 518, 503, 504, 515, 368–372; 438/199, 202, 227, 309, 218, 219, 348, 361, 223, 224, 208, 207, 294, 427, 205

(56) References Cited

U.S. PATENT DOCUMENTS

| | | | | |
|---|---|---|---|---|
| 4,912,054 A | * | 3/1990 | Tomassetti ................... | 438/208 |
| 5,031,019 A | * | 7/1991 | Kosaka et al. ............... | 257/370 |
| 5,332,683 A | * | 7/1994 | Miyashita et al. ........... | 438/432 |
| 5,376,816 A | * | 12/1994 | Nishigoori et al. ......... | 257/370 |
| 5,583,363 A | * | 12/1996 | Momose et al. ............. | 257/378 |
| 5,631,572 A | * | 5/1997 | Sheen et al. ................. | 324/754 |
| 5,665,994 A | * | 9/1997 | Palara .......................... | 257/378 |
| 5,880,002 A | * | 3/1999 | Hutter et al. ................ | 438/358 |
| 5,880,515 A | * | 3/1999 | Bartlett ........................ | 257/547 |
| 6,034,402 A | * | 3/2000 | Ammo et al. ................ | 257/370 |
| 6,208,190 B1 | | 3/2001 | Lukoff | |
| 6,225,181 B1 | * | 5/2001 | Gregory ...................... | 438/355 |
| 6,225,674 B1 | * | 5/2001 | Lim et al. .................... | 257/506 |
| 6,525,392 B1 | * | 2/2003 | Leonardi ...................... | 257/500 |

* cited by examiner

*Primary Examiner*—Donghee Kang
*Assistant Examiner*—Quang Vu

(57) ABSTRACT

An integrated circuit having improved isolation includes a first circuit section formed in a substrate and a second circuit section formed in the substrate, the second circuit section being spaced laterally from the first circuit section. The integrated circuit further includes an isolation buried layer formed under at least a portion of the first circuit section, and a conductive layer formed on a surface of the substrate and electrically coupled to the buried layer and to a voltage reference, the conductive layer reducing an effective lateral resistance of the buried layer, whereby an isolation between the first and second circuit sections is increased. A second isolation buried layer can be formed under at least a portion of the second circuit section as well to provide further isolation between the first and second circuit sections.

18 Claims, 7 Drawing Sheets

200

450

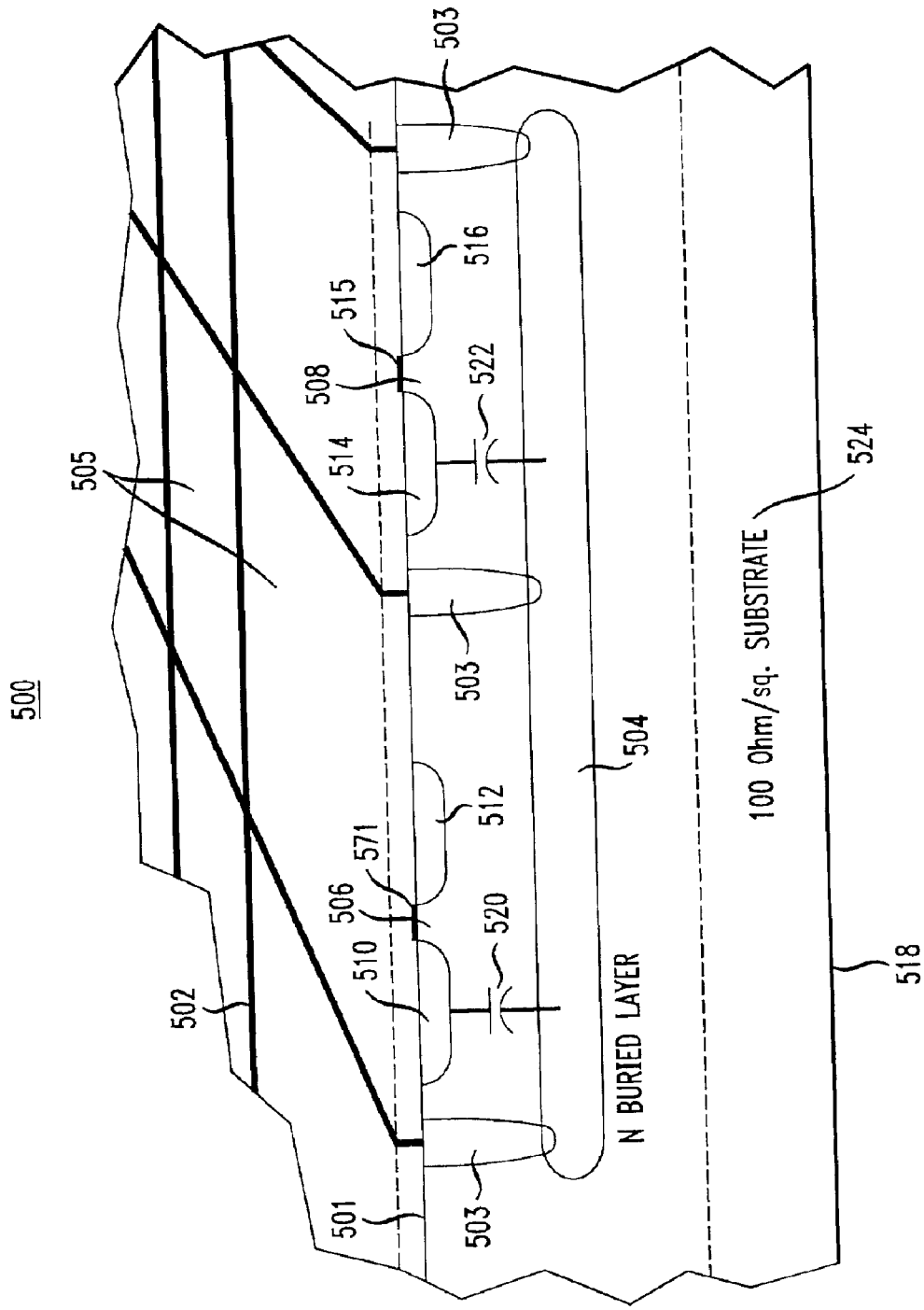

MIXED SIGNAL INTEGRATED CIRCUIT WITH IMPROVED ISOLATION

FIELD OF THE INVENTION

The present invention relates generally to mixed signal integrated circuit (IC) devices, and more particularly relates to techniques for improving isolation in a mixed signal IC device by reducing a resistance of a buried layer in the IC device.

BACKGROUND OF THE INVENTION

Mixed signal integrated circuits (ICs) provide both analog and digital circuitry on a common substrate. For example, a mixed signal IC may include one or more sensitive radio frequency (RF) analog circuits, such as a mixer, voltage-controlled oscillator (VCO) and low-noise amplifier (LNA), as well as one or more digital logic circuits, such as a digital signal processor (DSP) or frequency synthesizer. These RF circuits generally operate at frequencies of 1 Gigahertz (GHz) and above. One of the disadvantages inherent in conventional mixed signal ICs is the problem of isolating sensitive analog circuitry from the digital circuitry, which typically generates more noise, particularly in a radio frequency (RF) band of interest due at least in part to the sharp edges of the digital signals present in all continuously running digital logic circuitry. As the frequency of these digital signals increases, so does the noise generated by the digital circuitry.

For applications in an RF frequency range, digital noise generated by the digital logic circuitry is more effectively coupled to the sensitive analog circuitry through the common substrate and can adversely affect the operation of the analog circuitry. At RF frequencies, a dominant mechanism for coupling digital noise to the substrate becomes the drain-to-substrate capacitance associated with digital devices comprising the digital logic circuitry which becomes lower in impedance. Contributing to a reduced attenuation of the digital noise is the fact that the inductance of a substrate-to-ground connection is a higher impedance in an RF frequency range, thereby making it harder to shunt the digital noise to ground. A desired attenuation of the digital noise at RF frequencies is typically greater than 10,000 to 1 (i.e., >80 decibels (dB)).

Various techniques have been proposed and utilized in an attempt to isolate noisy digital circuitry from sensitive analog circuitry within the same IC, thereby reducing some or substantially all of the various noise problems caused by the digital circuitry. Such techniques include isolation by physical separation of the analog and digital sections of the IC; isolation by providing separate power supply rails; isolation by grounded guard rings/substrate trenches around the analog and/or digital section; employing differential circuitry in the sensitive analog section; use of low noise injecting digital circuitry, such as current steering logic; making the digital circuitry sections synchronous with the analog function; and moving the clock edges away from critical analog sampling instances. Such conventional approaches to noise reduction and/or isolation, however, are generally not always sufficient or fully effective, and may not be practical, feasible, or otherwise cost-effective to implement in a given application.

Conventionally, a low impedance substrate having a low impedance connection to ground has been utilized to achieve the above-noted 80 dB attenuation objective. However, the low impedance substrate, while generally used to reduce latch-up in digital complimentary metal-oxide-semiconductor (CMOS) circuitry, undesirably reduces the quality factor or Q of on-chip metal inductors. Another conventional technique, called triple-well, places an N-type buried layer under the digital CMOS circuitry. This buried layer is connected to ground at the edge of the digital logic area to shunt away some of the digital noise which would otherwise be coupled to the substrate.

Accordingly, there exists a need for techniques, for use in mixed signal ICs and other devices, that provide improved isolation, particularly in an RF frequency range of operation, between digital and analog circuitry residing on a common substrate.

SUMMARY OF THE INVENTION

The present invention provides techniques for improving isolation in a mixed signal integrated circuit (IC) or other device, particularly in an RF frequency range of operation, the mixed signal IC or other device having a digital circuit section and an analog circuit section formed on a common substrate. An isolation buried layer is formed under at least a portion of the digital circuit section. An effective lateral resistance of the isolation buried layer is reduced, in accordance with the invention, by forming a conductive layer on an upper surface of the IC, preferably in the form of a conductive net coincident with at least a portion of the digital circuit section. In addition to reducing the lateral resistance of the buried layer, the conductive net collects noise signals generated primarily by the digital circuitry on the surface of the IC and shunts these signals to ground or to another reference source to which the conductive layer is connected. The reduced lateral resistance of the buried layer provides a low resistance path, as compared to the substrate, that shunts to ground digital noise signals which would otherwise be coupled through the substrate to sensitive analog circuitry.

In accordance with one aspect of the invention, a mixed signal IC having improved isolation comprises a digital circuit section formed in a substrate and an analog circuit section formed in the substrate, the analog circuit section being spaced laterally from the digital circuit section. The IC further includes an isolation buried layer formed under at least a portion of the digital circuit section and a conductive layer formed on an upper surface of the silicon and operatively coupled to the isolation buried layer. The conductive layer reduces an effective lateral resistance of the isolation buried layer, whereby an electrical isolation between the digital and analog circuit sections is increased, thus significantly attenuating noise generated by the digital circuit section.

In accordance with another aspect of the invention, the isolation buried layer is formed under at least a portion of both the analog and digital circuit sections of the IC. Separate conductive layers are formed on the upper surface of the silicon above at least a portion of the digital and analog circuit sections, respectively, with each conductive layer being operatively coupled to a corresponding isolation buried layer. In a manner consistent with the attenuation of the digital noise, noise originating from the analog circuit section may be substantially prevented from being coupled into the digital circuit section via the common substrate.

The present invention also provides a method for reducing an effective lateral resistance of a buried layer in an IC. The method includes forming first and second circuit sections in a common substrate, the second circuit section being spaced laterally from the first circuit section. The method further includes forming an isolation buried layer in the substrate under at least a portion of the first circuit section and forming a conductive layer on a surface of the substrate, the conductive layer overlaying at least a portion of the first circuit section. A plurality of conductive plugs are formed in the substrate for operatively connecting the isolation buried layer to the conductive layer, whereby an effective lateral resistance of the isolation buried layer is reduced.

These and other features and advantages of the present invention will become apparent from the following detailed description of illustrative embodiments thereof, which is to be read in connection with the accompanying drawings.

BRIEF DESCRIPTION OF THE DRAWINGS

FIG. 5 is a vertical cross-sectional view of at least a portion of a mixed signal IC employing a buried layer and an electrically conductive net coupled to the buried layer, in accordance with one aspect of the present invention.

DETAILED DESCRIPTION OF THE PREFERRED EMBODIMENTS

The present invention will be described herein in the context of illustrative mixed-signal integrated circuit (IC) devices. It should be appreciated, however, that the present invention is not limited to these or any other particular semiconductor device structures. Rather, the invention is more generally applicable to any semiconductor device in which it is desirable to reduce an effective lateral resistance of a buried layer by employing a conductive layer formed on a surface of the device. Furthermore, for simplification purposes only, one or more conventional semiconductor fabrication layers (e.g., p-type well, epitaxial layer, etc.) may not be shown in the several figures, but it is to be appreciated that these additional fabrication layers, where required, are nonetheless present in the IC device, as will be understood by those skilled in the art.

Figure 1A:
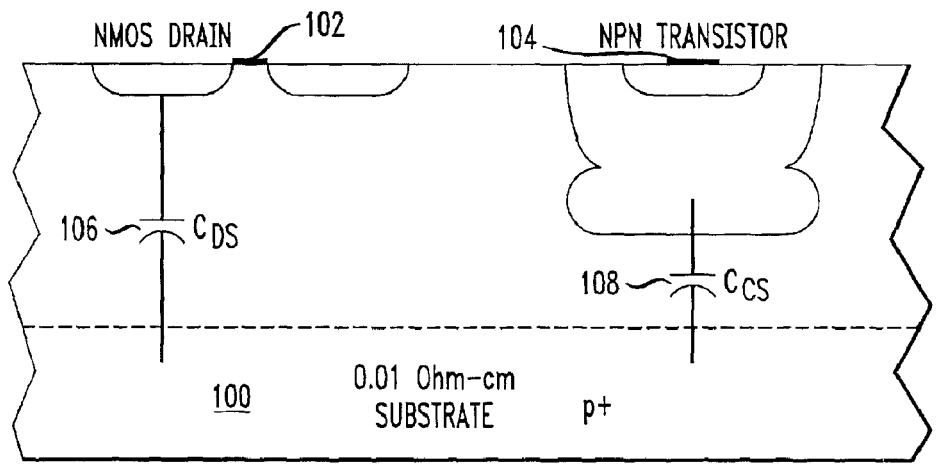
FIG. 1A is a vertical cross-sectional view of a conventional mixed signal integrated circuit (IC) illustrating an NMOS transistor and an NPN transistor and having a low resistance substrate.

FIG. 1A depicts a vertical cross sectional view of a conventional mixed signal IC having a relatively low resistance substrate 100 (e.g., 0.01 ohm-cm). The digital logic is represented by an NMOS transistor 102 and the analog circuitry is represented by an NPN transistor 104 fabricated in the same substrate 100. A drain-to-substrate capacitance $C_{DS}$ 106 of NMOS transistor 102 is typically about 50 femtofarad (fF) which corresponds to an impedance of 3000 ohms at a frequency of 1 GHz. Similarly, a collector-to-substrate capacitance $C_{CS}$ 108 of NPN transistor 104 is typically about 50 fF corresponding to an impedance of 3000 ohms at a frequency of 1 gigahertz (GHz).

Figure 1B:
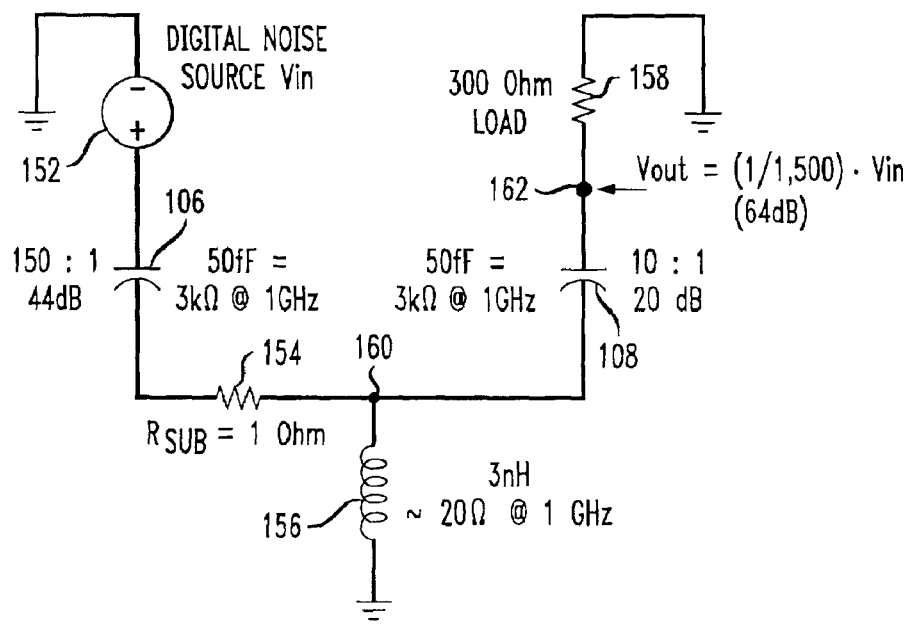
FIG. 1B is a schematic diagram illustrating a simplified equivalent circuit model for the IC shown in FIG. 1A.

With reference now to FIG. 1B, an equivalent circuit model 150 for the IC shown in FIG. 1A is depicted. Noise associated with the NMOS transistor (and thus the digital logic) is modeled as a digital noise source 152 labeled Vin. The drain-to-substrate capacitance $C_{DS}$ 106 is connected to the digital noise source 152 at one end and to a substrate resistor $R_{SUB}$ 154 at the other end. Resistor $R_{SUB}$ 154 represents the low impedance substrate which may be about 1 ohm in this illustration. The collector-to-substrate capacitance $C_{CS}$ 108 is coupled to the substrate resistor $R_{SUB}$ 154 at one end and to a 300 ohm load resistor 158 at the other end. The equivalent circuit model 150 further includes an inductor 156 connected to the junction of the substrate resistor 154 and collector-to-substrate capacitance $C_{CS}$ 108 at node 160. The inductor 156 models the substrate ground contact and bonding wiring, which typically has an inductance of about 3 nanohenrys (nH) corresponding to an impedance of 20 ohms at a frequency of 1 GHz.

The attenuation of the digital noise source 152 with respect to a voltage at node 160 (e.g., provided by the drain-to-substrate capacitance 106 and substrate resistance 154) can be calculated to be about 150 to 1, or 44 dB (i.e., 3000 ohms/20 ohms). Likewise, the attenuation of the voltage at node 160 provided by the collector-to-substrate capacitance $C_{CS}$ 108, with respect to an output node 162 which is the junction of the load resistor 158 and collector-to-substrate capacitance $C_{CS}$ 108, can be calculated to be 10 to 1, or 20 dB (i.e., 3000 ohms/300 ohms). Therefore, the total attenuation of the digital noise source 152 as measured at the output node 162 (i.e., Vout/Vin) will be 64 dB, which is less than an attenuation objective of 80 dB.

Figure 2:
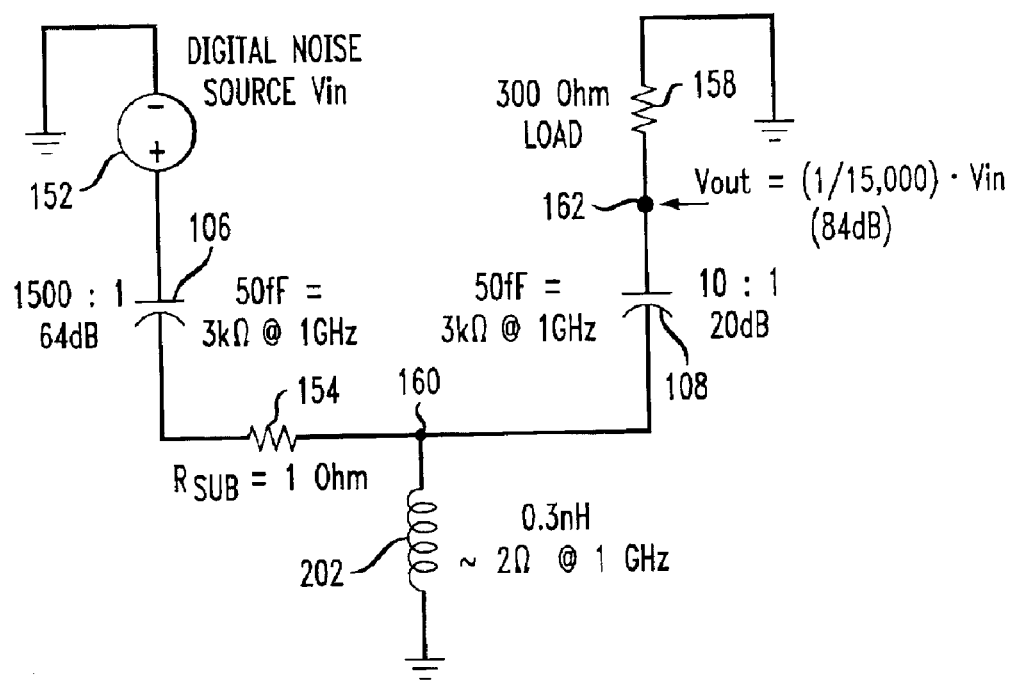
FIG. 2 is a schematic diagram illustrating a simplified equivalent circuit model for a conventional mixed signal IC having a low resistance substrate and a low impedance ground connection.

As previously stated, a desired attenuation of 80 dB can be achieved conventionally by employing a low resistance substrate (e.g., 0.01 ohm-cm) in conjunction with a low impedance ground connection. With reference to FIG. 2, an equivalent circuit model 200 is shown which is substantially the same as the circuit model of FIG. 1I3 except that a low impedance connection between the substrate and ground is provided, as modeled by an inductor 202 having an inductance of 0.3 nH. Inductor 202 has an effective impedance of 2 ohms at a frequency of 1 GHz, which is a factor of 10 lower than the inductor 156 of FIG. 1B.

With continued reference to FIG. 2, the attenuation of the digital noise source 152, with respect to a voltage at node 160, can be calculated to be 1500 to 1, or 64 dB (i.e., 3000 ohms/2 ohms). The attenuation of the voltage at node 160 provided by the collector-to-substrate capacitance $C_{CS}$ 108, as measured with respect to output node 162, will be the same as calculated above, namely, 10 to 1, or 20 dB. Therefore, the total attenuation of the digital noise source 152 as measured at the output node 162 (i.e., Vout/Vin) will be 84 dB, which meets the 80 dB attenuation objective. However, while this attenuation may be satisfactory for applications not employing inductors, the low impedance substrate significantly diminishes the Q of any inductors fabricated on the IC, as discussed above, and therefore this conventional approach cannot be successfully utilized in such applications.

Figure 3A:
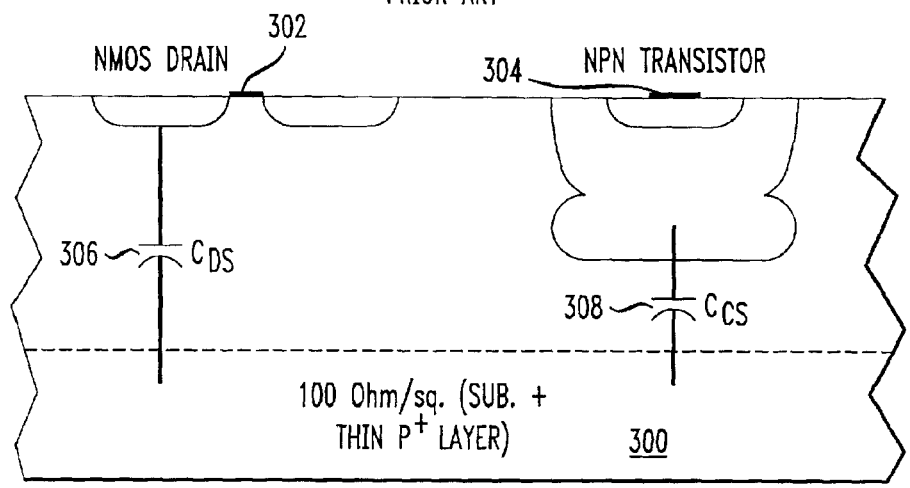
FIG. 3A is a vertical cross-sectional view of a conventional mixed signal IC having a high resistance substrate.

FIG. 3A illustrates a vertical cross sectional view of a conventional mixed signal IC having a relatively high resistance substrate 300 (e.g., 100 ohms per square). In a manner consistent with FIG. 1A, the digital logic is preferably represented by an NMOS transistor 302 and the analog circuitry is represented by an NPN transistor 304 fabricated in the same substrate 300. A drain-to-substrate capacitance $C_{DS}$ 306 associated with NMOS transistor 302 is typically about 50 fF which corresponds to an impedance of about 3000 ohms at a frequency of 1 GHz. Similarly, a collector-to-substrate capacitance $C_{CS}$ 308 associated with NPN transistor 304 is typically about 50 fF corresponding to an impedance of about 3000 ohms at a frequency of 1 GHz.

Figure 3B:
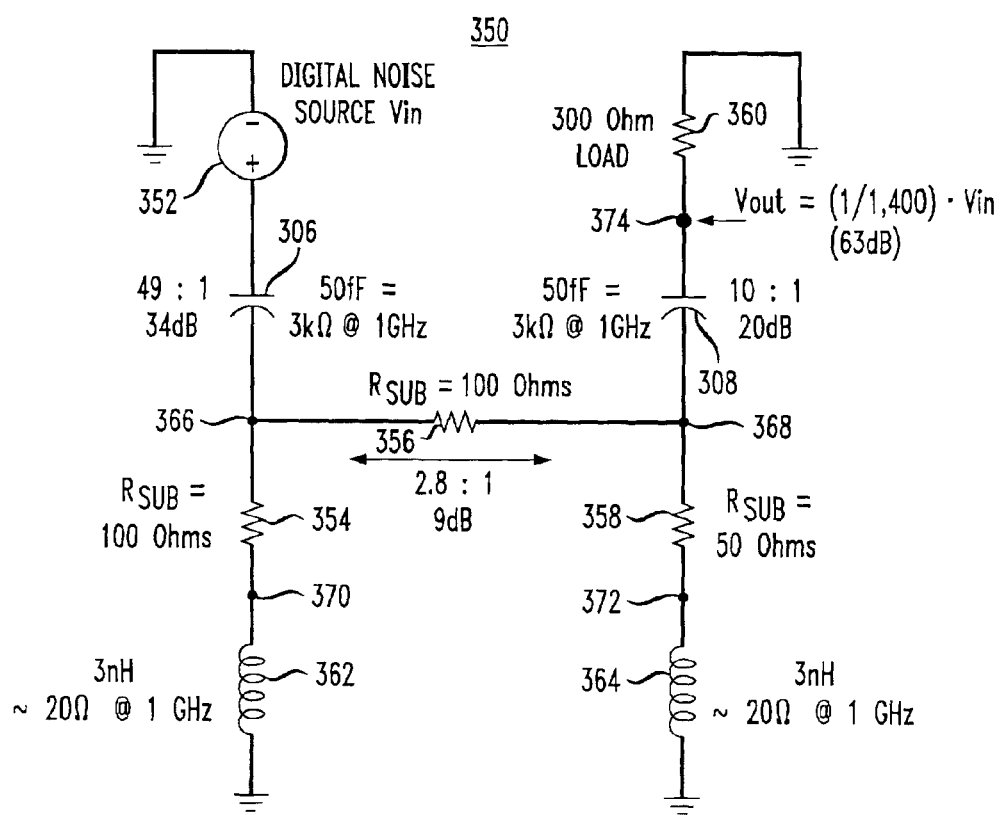
FIG. 3B is a schematic diagram illustrating a simplified equivalent circuit model for the IC shown in FIG. 3A including a double ground contact.

With reference now to FIG. 3B, an equivalent circuit model 350 for the IC shown in FIG. 3A is depicted. Noise associated with the digital logic (represented as NMOS transistor 302) is modeled as a digital noise source 352 labeled Vin. The equivalent circuit model 350 includes two substrate ground connections. Accordingly, the substrate resistance may be modeled as a distributed resistance network comprising resistors 354, 356 and 358 connected in a typical pi-type configuration. Specifically, resistors 354 and 358 form legs of the network, with each resistor 354, 358 being connected to an end of resistor 356 at nodes 366 and 368, respectively. In the illustrative circuit model 350, resistors 354, 356 each have a value of 100 ohms and resistor 358 has a value of 50 ohms. A substrate-to-ground impedance associated with the two substrate ground connections is modeled by inductors 362, 364 connected to the substrate resistor network at nodes 370, 372, respectively, at one end and to ground at another end. Each inductor 362, 364 has an estimated inductance of about 3 nH corresponding to an impedance of about 20 ohms at a frequency of 1 GHz. The drain-to-substrate capacitance $C_{DS}$ 306 is connected to the digital noise source 352 at one end and to a first end of the distributed substrate resistor network at node 366 at another end. Likewise, the collector-to-substrate capacitance $C_{CS}$ 308 is coupled to a 300 ohm load resistor 360 at one end and to a second end of the distributed substrate resistor network at node 368 at another end.

The attenuation of the digital noise source 352 with respect to a voltage measured at node 366 (i.e., provided by the drain-to-substrate capacitance $C_{DS}$ 306) can be calculated to be about 49 to 1, or 34 dB. The attenuation of the voltage at node 366 provided by the substrate resistor 356 is about 2.8 to 1, or about 9 dB, as measured at node 368. Likewise, the attenuation of the voltage at node 368 provided by the collector-to-substrate capacitance $C_{CS}$ 308, with respect to an output node 374 (which is the junction of the load resistor 360 and collector-to-substrate capacitance $C_{CS}$ 308) can be calculated to be 10 to 1, or 20 dB. Therefore, the total attenuation of the digital noise source 352 as measured at the output node 374 (i.e., Vout/Vin) will be about 1/1400, or 63 dB, which is below the desired 80 dB attenuation.

Figure 4A:
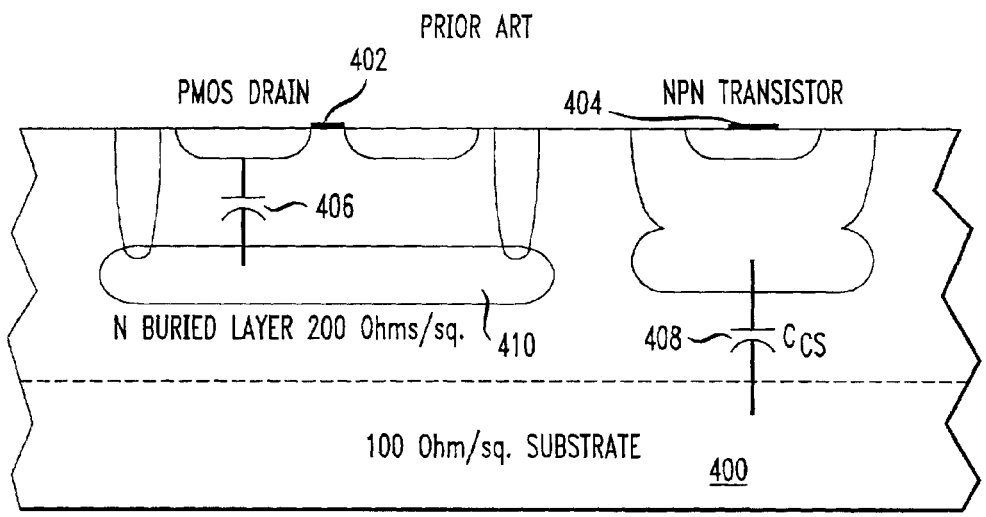
FIG. 4A is a vertical cross-sectional view of a conventional mixed signal IC having a high resistance substrate and employing a triple-well with an n-type buried layer under a PMOS transistor.

FIG. 4A illustrates a vertical cross sectional view of a conventional mixed signal IC having a relatively high resistance substrate 400 (e.g., 100 ohms per square) and two substrate ground connections, consistent with the IC shown in FIG. 3A. In this illustration, a PMOS transistor 402 is used to represent the digital logic and, as before, the analog circuitry is represented by an NPN transistor 404 fabricated on the same substrate 400. As depicted in FIG. 4A, the IC includes an n-type buried layer 410 beneath the PMOS transistor 402. The buried layer 410 is typically formed by a triple-well process, as understood by those skilled in the art, and has a lateral resistance of about 200 ohms per square. A drain-to-buried layer capacitance 406 associated with PMOS transistor 402 (which may include a metal-to-well capacitance and a well-to-buried-layer capacitance) is typically about 50 fF which corresponds to an impedance of about 3000 ohms at a frequency of 1 GHz. Similarly, a collector-to-substrate capacitance $C_{CS}$ 408 associated with NPN transistor 404 is typically about 50 fF corresponding to an impedance of about 3000 ohms at a frequency of 1 GHz, as depicted in the previous figures.

Figure 4B:
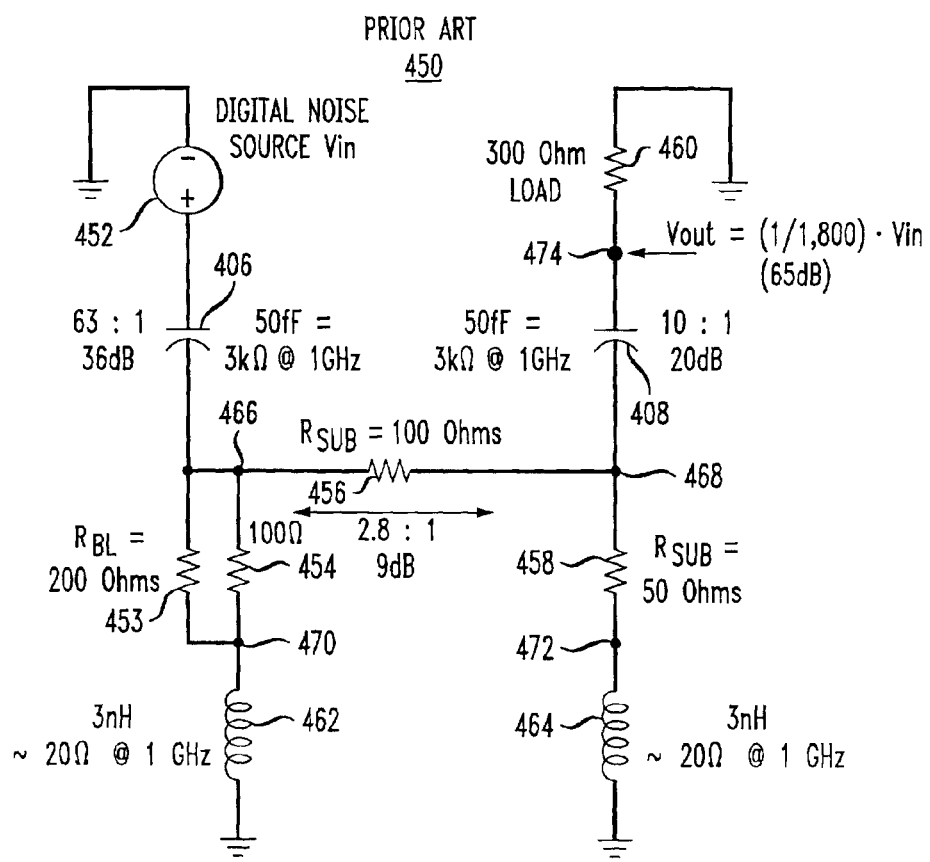
FIG. 4B is a schematic diagram illustrating a simplified equivalent circuit model for the IC shown in FIG. 4A.

With reference now to FIG. 4B, an equivalent circuit model 450 is shown for the IC of FIG. 4A. Noise associated with the digital logic (represented as PMOS transistor 402) is modeled as a digital noise source 452 labeled Vin. The equivalent circuit model 450 includes two substrate ground connections. In a manner consistent with the circuit shown in FIG. 3B, the substrate resistance can be modeled as a distributed resistance network comprising resistors 454, 456 and 458 connected in a pi-type configuration. Specifically, resistors 454 and 458 form legs of the network, with each resistor 454, 458 being connected to an end of resistor 456 at nodes 466 and 468, respectively. In the circuit model, resistors 454, 456 each have an estimated value of 100 ohms and resistor 458 has a value of 50 ohms, as in the previous circuit model depicted in FIG. 3B. The resistance of the buried layer is modeled by resistor $R_{BL}$ 453 which is connected in parallel with substrate resistor 454. The buried layer resistor 453 typically has a value of about 200 ohms. A substrate-to-ground impedance associated with the two substrate ground connections is modeled by inductors 462, 464 connected to the substrate resistor network at nodes 470, 472, respectively, at one end and to ground at another end. Each inductor 462, 464 has an inductance of about 3 nH corresponding to an impedance of about 20 ohms at a frequency of 1 GHz. Capacitance 406 is connected to the digital noise source 452 at one end and to a first end of the distributed substrate resistor network at node 466 at the other end. Likewise, the collector-to-substrate capacitance 408 is coupled to a 300 ohm load resistor 460 at one end and to a second end of the distributed substrate resistor network at node 468 at another end. The load resistor 460 is connected to an equivalent alternating current (AC) ground and represents an effective load associated with the analog circuitry.

The attenuation of the digital noise source 452 with respect to a voltage measured at node 466 (i.e., due to capacitance 406) can be calculated to be about 63 to 1, or 36 dB. The attenuation of the voltage at node 466 is about 2.8 to 1, or 9 dB, as measured at node 468 (i.e., due to the substrate impedance). Likewise, the attenuation of the voltage at node 468 provided by the collector-to-substrate capacitance 408, with respect to an output node 474 (which is the junction of the load resistor 460 and collector-to-substrate capacitance 408) can be calculated to be about 10 to 1, or 20 dB. By summing the respective attenuation amounts along a path from the digital noise source 452 to the output node 474, the total attenuation (i.e., Vout/Vin) will be about 1/1800, or 65 dB, which again is below the desired 80 dB attenuation.

With regard to the IC illustrated in FIG. 4A, as well as the corresponding equivalent circuit model depicted in FIG. 4B, it is to be appreciated that one or more capacitances may have been omitted, at least in part for ease of explanation. For example, a capacitance between the buried layer 410 and substrate 400 is not depicted in FIG. 4A. This capacitance, however, is of such a high value that it does not significantly effect the estimated attenuation calculations described herein above.

Traditionally, the effective resistance of the buried layer in conventional mixed signal ICs has been too high to provide the required level of noise and signal attenuation in the ICs, particularly in the RF frequency range of interest. As previously stated, it is at high frequencies (e.g., around 1 GHZ and above) that the substrate coupling becomes a dominant mechanism for the undesirable coupling of digital noise into the analog circuit section. Accordingly, an important objective of the present invention is to reduce an effective lateral resistance of a buried layer employed as an isolation layer under at least the digital circuitry of the mixed signal IC, and thereby increase an isolation between the analog and digital circuit sections of the IC.

FIG. 5 depicts a vertical cross sectional view of a mixed signal IC 500 having improved isolation, formed in accordance with one aspect of the invention. The IC 500 comprises a relatively high resistance substrate 524 (e.g., about 100 ohms per square) in which the functional components of the present invention are formed. A digital circuit section of the illustrative mixed signal IC 500 is preferably represented by NMOS transistors 506, 508, each of the NMOS transistors having a drain area 510, 514, agate 511, 515, and a source area 512, 516, respectively. Pads (not shown) are preferably formed on an exterior periphery of the IC for connecting, e.g., through bond wires, circuit sections formed in the substrate to at least a positive and negative voltage supply, such as, for example, VDD and ground, respectively. An isolation buried layer 504 is placed beneath at least a portion of the digital circuit section of the illustrative mixed signal IC and is preferably formed of, for example, $n^+$-type material in a p-type substrate 524 using a conventional semiconductor fabrication process, as will be understood by those skilled in the art. The isolation buried layer is preferably separate and distinct from other layers in the substrate. The sheet resistance of the buried layer diffusion is about 20 ohms per square, and the impurity used in the diffusion process is preferably arsenic, although other suitable impurities may be similarly employed. It is to be appreciated that the isolation buried layer 504 may also be formed of p-type material in a similar manner. The mixed signal IC 500 further includes a drain-to-buried layer capacitance 520, 522 associated with each of the NMOS transistors 506, 508, respectively. Although not shown, transistors 506, 508 are preferably formed in a p-well, and thus capacitances 520, 522 may include a metal-to-p-well capacitance component as well as a p-well-to-buried layer capacitance component.

The isolation buried layer 504 is preferably fabricated in the substrate 500 to be at least 2 micrometers ($\mu$m) to 3 $\mu$m deep (measured from an upper surface 501 of the substrate), otherwise a higher capacitance between the buried layer and the drain areas (e.g., 510,514) of the digital circuit devices may undesirably compromise the speed and/or performance of the digital circuitry. However, if the isolation buried layer is formed too deep in the substrate (e.g., greater than about 5 $\mu$m), the resistance of an electrical path from the upper surface 501 to the isolation buried layer 504 may be too high, therefore negating the benefits of the invention in reducing the lateral resistance of the buried layer. Consequently, a preferred depth for the isolation buried layer 504, as measured vertically from the upper surface 501 of the substrate, is in a range of about 2 $\mu$m to about 5 $\mu$m, in accordance with present invention.

It is to be appreciated that when an isolation buried layer is used with a bipolar transistor device, which generally already includes a collector buried layer used to form a collector terminal of the bipolar transistor, the collector buried layer may be formed as a second buried layer (not shown) in the substrate, preferably at a depth of about 0.6 $\mu$m to about 1.0 $\mu$m as measured from the upper surface 501 of the substrate (i.e., above the isolation buried layer 504). In modern high-speed bipolar analog circuitry, bipolar transistors are fabricated having shallow collector buried layers to decrease a transit time through the device. Thus, it is possible to form the isolation buried layer beneath the collector buried layer. It is to be appreciated that the isolation buried layer 504 may be formed as a continuous layer under the entire digital circuit section of the IC. Alternatively, the IC may comprise a plurality of isolation buried layers (not shown), with each individual buried layer being formed under a single device or group of devices, in accordance with the present invention.

With continued reference to the illustrative IC shown in FIG. 5, on the upper surface 501 of the substrate, which may be, for example, an upper surface of a silicon dioxide layer, a conductive net 502 is formed for reducing the effective lateral resistance of the buried layer 504. The conductive net 502, which may comprise a number of intersecting conductive traces, can be patterned onto the surface 501 of the substrate using conventional photo lithographic techniques, as will be known by those skilled in the art. It is to be appreciated that the conductive net can also be formed as a distinct metallization layer in a multilayer metallization process. Moreover, the conductive net 502 may be formed with separate segments fabricated using two or more layers of metal. These metal segments can be connected together, for example, using vias to form the conductive net or suitable alternative structure, with an upper metal layer being operatively connected to the buried layer as will be described below. Other fabrication process layers (e.g., one or more passivation layers) may also be deposited over the conductive net 502 as desired. In either case, conductive net 502 preferably overlays, but is not directly connected to, the digital circuitry and associated interconnect metal. While functioning to reduce the effective lateral resistance of the buried layer, the conductive net 502 also serves to collect signals at the surface of the IC in close relative proximity to the conductive net (e.g., digital logic signals) and shunt these signals to ground or another reference source, away from the substrate where they might otherwise be undesirably coupled to the sensitive analog circuitry.

The isolation buried layer 504 is connected to the conductive net 502 on the surface 501 of the substrate via a plurality of diffused low-resistance "plugs" (e.g., n+ sinkers) 503 which are preferably dispersed at predetermined points throughout the digital circuit section of the IC for providing multiple low resistance connections between the isolation buried layer 504 and the conductive net 502. Preferably, the distance between any two plugs is close enough such that the isolation buried layer is sufficiently connected to the conductive layer, preferably in a substantially uniform manner. The conductive plugs 503 may be formed, for example, by a phosphorous predeposition step in the semiconductor fabrication process, as will be understood by those skilled in the art. The conductive net is then preferably connected to ground, or another suitable reference voltage source for providing an equivalent AC ground, at least at a lateral edge of the digital circuit section.

A "fineness" of the conductive net 502, which as used herein refers to the size of "holes" 505 in the conductive net, will depend at least in part upon the density and/or placement of circuit components (e.g., transistors) in the digital circuit section of the IC. In order for the resistance of the conductive net to be made as low as possible, the holes 505 in the conductive net should be made as small as practicable. The holes 505 in the conductive net 502 cannot be made arbitrarily small, but must be formed large enough to accommodate the circuitry which the net is preferably coincident with. For example, each transistor 506, 508 in the digital logic section may be placed in a corresponding hole 505 in the conductive net 502. The number of conductive plugs 503 used to connect the isolation buried layer 504 to the conductive net 502 is likewise not arbitrary but rather depends at least in part upon component and/or interconnect placement (i.e., density). It is to be appreciated that the effective lateral resistance of the isolation buried layer 504 will be inversely proportional to the number of plugs used (i.e., the greater the number of plugs used, the lower the lateral resistance of the isolation buried layer). However, since the plugs 503 may increase, to some extent, the physical size of the IC, a preferred number of plugs reflects a desired balance between IC component density and reduced lateral resistance of the buried layer (and thus increased noise attenuation in the IC). Using the conductive net 502 of the present invention, the effective lateral resistance of the isolation buried layer 504 can be reduced by at least a factor of ten, depending at least in part on the fineness of, and the materials used to form, the conductive net.

The conductive net 502 is preferably formed of metal or other conductive material. The metal used to form the conductive layer 502 may be the same type used to form interconnections, such as, but not limited to, aluminum. Typically, the resistivity of aluminum is of the order of $2.8 \times 10^{-6}$ ohm-cm. In the case of an aluminum trace of 1 $\mu$m thickness, this corresponds to a sheet resistance of approximately 0.03 ohms per square. In comparison, the resistivity of the buried layer 504 is of the order of 20 ohms per square. The metal conductors in the conductive net 502 of the present invention effectively reduce the lateral resistance of the buried layer 504 by providing a lower resistance path, as compared to the resistance of the buried layer alone, between any two points in the buried layer. Although shown as a mesh-like net arrangement in FIG. 5, the present invention similarly contemplates that the conductive net 502 may be fabricated using any suitable configuration or structure in which the effective lateral resistance of the buried layer 504, to which the conductive net is connected, is thereby reduced.

Figure 6A:
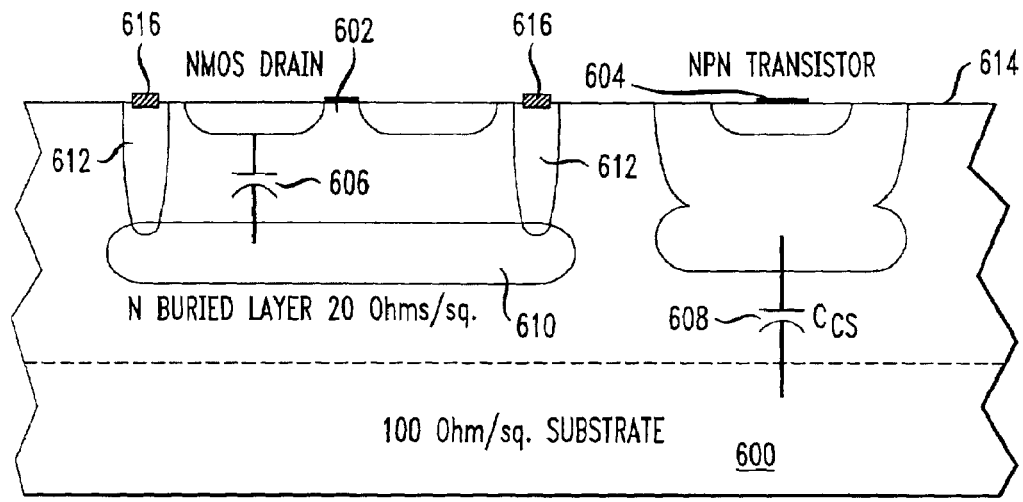
FIG. 6A is a vertical cross-sectional view of a mixed signal IC having a high resistance substrate and employing a complimentary metal-oxide-semiconductor (CMOS) digital circuit section and a bipolar analog circuit section, in accordance with the present invention.

FIG. 6A illustrates a vertical cross sectional view of a mixed signal IC having a relatively high resistance substrate 600 (e.g., 100 ohms per square), formed in accordance with the present invention. In this exemplary embodiment, an NMOS transistor 602 is used to represent a digital circuit section and an analog circuit section is represented by an NPN transistor 604 fabricated in the same substrate 600. The IC includes an n$^+$-type isolation buried layer 610 formed beneath the NMOS transistor 602. Although not shown, the NMOS transistor 602 is preferably formed in a p-well which is diffused above the isolation buried layer 610, as measured from an upper surface 614 of the substrate. As stated above, the isolation buried layer 610 is preferably formed by a conventional semiconductor fabrication process, as will be understood by those skilled in the art, and has a lateral resistance of about 20 ohms per square. The effective lateral resistance of the buried layer 610 is reduced to about 2 ohms per square by connecting the isolation buried layer to a conductive net 616 formed on the upper surface 614 of the substrate, as previously described. The conductive net 616, which may be configured in the manner described above in conjunction with FIG. 5, is connected to the isolation buried layer 610 by way of a plurality of low resistance conductive plugs 612 which are preferably diffused into the substrate 600. A drain-to-buried layer capacitance 606 associated with NMOS transistor 602 (which may include a metal-to-p-well capacitance and a p-well-to-buried layer capacitance) is estimated to be about 50 fF. Similarly, a collector-to-substrate capacitance $C_{CS}$ 608 associated with NPN transistor 604 is estimated to be about 50 fF corresponding to an impedance of about 3000 ohms at a frequency of 1 GHz.

Figure 6B:
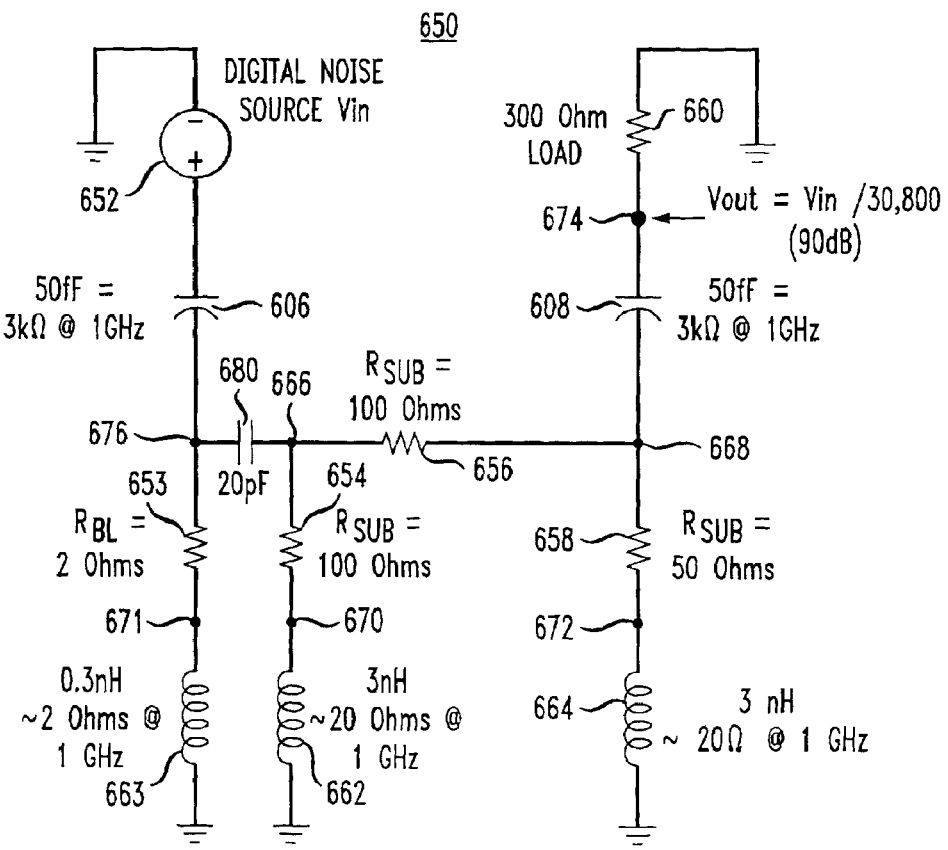
FIG. 6B is a schematic diagram illustrating a simplified equivalent circuit model for the IC shown in FIG. 6A.

With reference now to FIG. 6B, an equivalent circuit model 650 is shown for the IC of FIG. 6A. Noise associated with the digital circuitry (represented as NMOS transistor 602) is modeled as a digital noise source 652 labeled Vin. The substrate resistance can be modeled as a distributed resistance network comprising resistors 654, 656 and 658 connected in a pi-type configuration. Specifically, resistors 654 and 658 form legs of the network, with each resistor 654, 658 being coupled to an end of resistor 656 at nodes 666 and 668, respectively. Node 668 is a common node between resistors 656 and 658, which represent two contiguous parts of a common (e.g., p-type) substrate. Likewise, node 666 is the common node between resistors 654 and 656, which represent two contiguous parts of the common substrate. A coupling capacitor 680, operatively coupled between the distributed substrate resistance at node 666 and the digital noise source, is of the order of 20 picofarad (pF), which is effectively about an 8 ohm impedance at a frequency of 1 GHz, and preferably represents a capacitance between the buried layer 610 and the substrate 600. In the circuit model, resistors 654, 656 each have an estimated value of 100 ohms and resistor 658 has a value of about 50 ohms.

The illustrative equivalent circuit model 650 includes two substrate ground connections, although essentially any number of substrate connections may be used for tying the substrate 600 to a ground or other reference source. A substrate-to-ground impedance associated with the two substrate ground connections is modeled by inductors 662 and 664 connected to the substrate resistor network at nodes 670 and 672, respectively, at one end and to ground (or suitable reference) at another end. Inductors 662, 664 each have an inductance of about 3 nH (primarily due to the impedance of the bond wire, which typically has an inductance of about 1 nH/mm), which corresponds to an impedance of about 20 ohms at a frequency of 1 GHz.

The resistance of the isolation buried layer 610 is modeled by resistor $R_{BL}$ 653 which is operatively coupled at one end to the distributed substrate resistance network through capacitor 680 and to a buried layer ground connection at node 671 at another end. The buried layer resistor 653 has a value of about 2 ohms, which is at least a factor of 10 lower than a conventional buried layer as a result of the conductive net 616, as previously explained. Preferably, the IC uses a low impedance buried layer ground connection (e.g., using multiple bond wires, flip-chip bonding, etc.) to tie down the buried layer to an AC reference ground. This buried layer ground connection may be modeled as an inductor 663 connected between the buried layer resistor 653 at node 671 and ground (or another reference) and having an inductance of about 0.3 nH, corresponding to an impedance of about 2 ohms at a frequency of 1 GHz.

With continued reference to FIG. 6B, capacitor 606, which represents the drain-to-buried layer capacitance, is inherently coupled to the digital noise source 652 at one end and to a first end of the distributed substrate resistor network through capacitor 680 at another end. As stated above, capacitor 606 has a capacitance of about 50 fF, which corresponds to an impedance of about 3000 ohms at a frequency of 1 GHz. Likewise, capacitor 608, which represents the collector-to-substrate capacitance, is inherently coupled to a 300 ohm load resistor 660 (connected to ground) at one end and to a second end of the distributed substrate resistor network at node 668 at another end. The resistor 660 represents the load presented by the analog circuitry.

The attenuation of the digital noise source 652 with respect to a voltage measured at node 666 (i.e., due to capacitor 606) can be calculated to be about 1100 to 1, or 61 dB. The attenuation of the voltage at node 666 is about 2.8 to 1, or 9 dB, as measured at node 668 (i.e., due to the substrate impedance). Likewise, the attenuation of the voltage at node 668 provided by the collector-to-substrate capacitance 608, with respect to an output node 674 (which is the junction of the load resistor 660 and collector-to-substrate capacitance 608) can be calculated to be about 10 to 1, or 20 dB. By summing the respective attenuation amounts along a path from the digital noise source 652 to the output node 674, the total attenuation (i.e., Vout/Vin) will be about 1/30,800 or 90 dB, which is above the desired 80 dB attenuation goal. It is to be appreciated that this attenuation level is achieved without utilizing a low-resistance substrate which adversely affects the performance of RF inductors (e.g., spiral inductors) fabricated in the IC, as previously discussed.

Figure 7A:
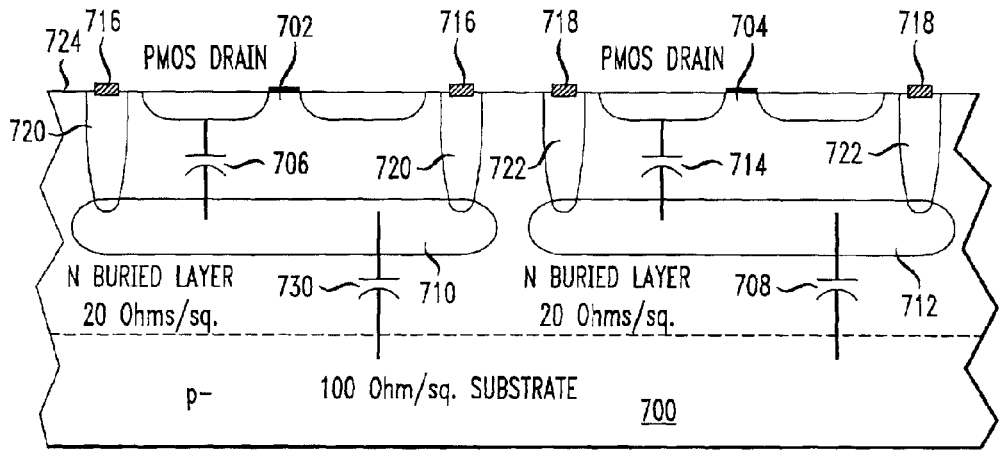
FIG. 7A is a vertical cross-sectional view of a mixed signal IC having a high resistance substrate and low impedance contacts, and employing CMOS digital and analog circuit sections, in accordance with another aspect of the invention.

FIG. 7A illustrates a vertical cross sectional view of a mixed signal IC having a relatively high resistance p-type substrate 700 (e.g., about 100 ohms per square), formed in accordance with another aspect of the invention. It is to be appreciated that although the present invention has been described herein using a p-type substrate material, an n-type substrate may also be employed with the present invention with minor modifications to one or more fabrication layers, as will be understood by those skilled in the art. In this illustrative embodiment, a first PMOS transistor 702 formed in the substrate 700 is used to represent a digital circuit section and an analog circuit section is preferably represented by a second PMOS transistor 704 fabricated in the same substrate. As similarly described above, the IC includes two or more $n^+$-type isolation buried layers 710, 712 formed beneath at least a portion of each of the digital and analog circuit sections, represented as PMOS transistors 702, 704, respectively. Each of the isolation buried layers 710, 712 is preferably formed using a conventional fabrication process and has a lateral resistance of about 20 ohms per square. The isolation buried layers 710, 712 are preferably separate and distinct from each other and from other layers comprising the IC.

As similarly explained above in conjunction with FIGS. 5 and 6A, the effective lateral resistance of the isolation buried layers 710, 712 is reduced by at least a factor of 10, to about 2 ohms per square, by the techniques of the present invention, specifically, by connecting each of the isolation buried layers to a corresponding conductive net 716, 718 (e.g., on an upper surface 724 of the substrate) associated with transistors 702, 704 representing the digital and analog circuit sections, respectively. Each conductive net 716, 718, which may be substantially the same as the conductive net previously described in connection with FIGS. 5 and 6A, is connected to a corresponding isolation buried layer 710, 712 by way of a plurality of low resistance conductive plugs (e.g., $n^+$ sinkers) 720, 722, respectively. The plugs 720, 722 are preferably fabricated and placed in the substrate 700 in a manner consistent with that described above. It is to be appreciated that each individual conductive net 716, 718 is connected through separate electrically conductive paths to at least one ground or reference source, preferably by way of a low impedance connection. In this manner, signals coupled to the respective conductive nets do not get coupled into an adjacent circuit section.

As depicted in FIG. 7A, a drain-to-buried layer capacitance associated with the digital circuit section may be represented by a capacitor 706 between a drain area of PMOS transistor 702 and the corresponding isolation buried layer 710. Similarly, a drain-to-buried layer capacitance associated with the analog circuit section may be represented by a capacitor 714 connected between a drain area of PMOS transistor 704 and the corresponding isolation buried layer 712. Additional capacitors 708, 730 are preferably included in the IC to represent the capacitance between the isolation buried layers 712, 710, respectively, and the substrate 700. These capacitors 708, 730 are relatively high in value (e.g., about 20 pF) as compared to the capacitance (e.g., 706, 714) between the drain area and buried layer, which is estimated to be about 50 fF.

Figure 7B:
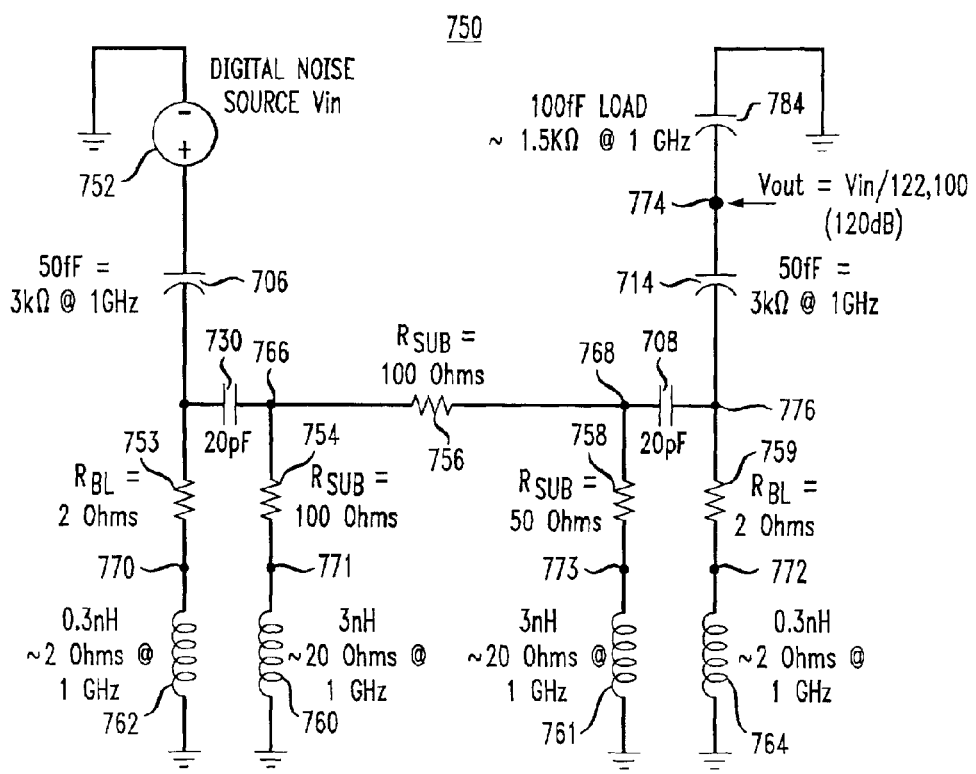
FIG. 7B is a schematic diagram illustrating a simplified equivalent circuit model for the IC shown in FIG. 7A.

With reference now to FIG. 7B, an equivalent circuit model 750 is shown for the IC of FIG. 7A. As previously shown, noise associated with the digital circuitry (represented as PMOS transistor 702) is modeled as a digital noise source 752 labeled Vin. As stated above, the substrate resistance is preferably modeled as a distributed resistance network comprising resistors 754, 756 and 758 connected in a pi-type configuration. Specifically, resistors 754 and 758 form legs of the network, with each resistor 754, 758 being coupled to an end of resistor 756 at nodes 766 and 768, respectively. Buried layer-to-substrate capacitors 708, 730 associated with the isolation buried layers 710, 712, respectively, are each of the order of 20 picofarad (pF), which are effectively about 8 ohm impedances at a frequency of 1 GHz. Capacitor 730 is operatively coupled between one end of the distributed substrate resistance at node 766 and the digital noise source. Likewise, capacitor 708 is coupled between an end of the distributed substrate resistance at node 768 and the drain-to-buried layer capacitor 714 at node 776. In the circuit model 750, resistors 754, 756 each have a value of about 100 ohms and resistor 758 has a value of about 50 ohms.

The illustrative equivalent circuit model 750 includes two substrate ground connections, although any reasonable number of substrate connections is contemplated by the present invention for tying the substrate 700 to a ground or other reference source. A substrate-to-ground impedance associated with the two substrate ground connections is preferably modeled by inductors 760 and 761 connected to the substrate resistance network at nodes 771 and 773, respectively, at one end and to ground (or a suitable reference) at another end. As stated above in connection with FIG. 6B, inductors 760, 761 each have an inductance of about 3 nH (primarily due to the impedance of the bond wire), which corresponds to an impedance of about 20 ohms at a frequency of 1 GHz.

The resistance of the buried layers 710, 712 is modeled by resistors $R_{BL}$ 753, 759, respectively. Resistor 753 is operatively coupled at one end to the distributed substrate resistance network through capacitor 730 and to a buried layer ground connection at node 770 at another end. Likewise, resistor 759 is operatively coupled at one end to the distributed substrate resistance network through capacitor 708 and to a buried layer ground connection at node 772 at another end. Each of the buried layer resistors 753, 759 has a value of about 2 ohms, which is at least a factor of 10 lower than a conventional buried layer as a result of the conductive net (716, 718, respectively) connected to a corresponding buried layer (710, 712, respectively), as previously explained. Preferably, the IC uses low impedance buried layer ground connections (e.g., using multiple bond wires, flip-chip bonding, etc.) to tie down the isolation buried layers to an AC reference ground. The buried layer ground connections may be modeled as inductors 762, 764, connected between a corresponding buried layer resistor 753, 759 at nodes 770, 772, respectively, and ground (or other reference), having an inductance of about 0.3 nH, corresponding to an impedance of about 2 ohms at a frequency of 1 GHz.

With continued reference to FIGS. 7A and 7B, capacitor 706, which represents the drain-to-buried layer capacitance associated with PMOS transistor 702, is inherently coupled to the digital noise source 752 at one end and to a first end of the distributed substrate resistor network through capacitor 730 at another end. As stated above, capacitor 706 has a capacitance of about 50 fF, which corresponds to an impedance of about 3000 ohms at a frequency of 1 GHz. Likewise, capacitor 714, which represents the drain-to-buried layer capacitance associated with PMOS transistor 704, is inherently coupled to a load capacitor 784 (connected to ground) at one end and to a second end of the distributed substrate resistor network through capacitor 708 at another end. Capacitor 784 represents the load presented by the analog circuitry with respect to an output node 774. Since the analog circuitry in the illustrative embodiment of FIG. 7A is represented by a PMOS transistor device (704), the loading presented to node 774 is essentially purely capacitive (e.g., gate capacitance).

The attenuation of the digital noise source 752 with respect to a voltage measured at node 766 (i.e., due to capacitor 706) can be calculated to be about 1100 to 1, or 61 dB. The attenuation of the voltage at node 766 is about 37 to 1, or about 31 dB, as measured at node 768 (i.e., due to the substrate impedance). Likewise, the attenuation of the voltage at node 768 provided by the drain-to-buried layer capacitance 714, with respect to output node 774 (which is the junction of the load capacitor 784 and drain-to-buried layer capacitance 714) can be calculated to be about 3 to 1, or 10 dB. By summing the respective attenuation amounts along a path from the digital noise source 752 to the output node 774, the total attenuation (i.e., Vout/Vin) will be about 1/122,100 or 102 dB, which is above the desired 80 dB attenuation goal. Again, this attenuation level is achieved without utilizing a low-resistance substrate which adversely affects the performance of RF inductors (e.g., spiral inductors) fabricated in the IC.

The techniques of the present invention as described herein may be used to provide improved isolation for sensitive analog circuitry residing on the same substrate as digital circuitry, which is inherently more noisy due, at least in part, to high frequency square waveforms utilized by the digital circuitry. Furthermore, the present invention may be employed in a more general sense to reduce the effective lateral resistance of a buried layer formed in a substrate. It is to be appreciated that although embodiments have been described herein using a p-type substrate, the invention similarly contemplates that n-type substrate material may be employed in combination with a p-type buried layer.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. An integrated circuit, comprising:
   a first circuit section formed in a substrate;
   a second circuit section formed in the substrate, the second circuit section being spaced laterally from the first circuit section;
   an isolation buried layer formed under at least a portion of the first circuit section; and
   a conductive layer formed on a surface of the integrated circuit and operatively coupled to the isolation buried layer at a plurality of points spaced throughout the buried layer, the conductive layer reducing an effective lateral resistance of the isolation buried layer to thereby increase an electrical isolation between the first and second circuit sections;
   wherein the conductive layer comprises a plurality of conductive traces, the conductive traces intersecting with and connecting to one another to form a net.

2. An integrated circuit, comprising:
   a first circuit section formed in a substrate;
   a second circuit section formed in the substrate, the second circuit section being spaced laterally from the first circuit section;
   an isolation buried layer formed under at least a portion of the first circuit section; and
   a conductive layer formed on a surface of the integrated circuit and operatively coupled to the isolation buried layer, the conductive layer reducing an effective lateral resistance of the isolation buried layer;
   wherein the conductive layer comprises a plurality of conductive traces, the conductive traces intersecting with and connecting to one another to form a net.

3. The integrated circuit of claim 2, further comprising:
   a plurality of conductive plugs formed in the substrate, the plugs providing a substantially low resistance path for electrically connecting the conductive layer to the isolation buried layer.

4. The integrated circuit of claim 2, wherein the net includes a plurality of holes therein, at least a portion of the first circuit section being formed in one or more holes in the net.

5. The integrated circuit of claim 2, wherein the net overlays at least a portion of the first circuit section.

6. The integrated circuit of claim 2, wherein the isolation buried layer is connected to a ground or reference source.

7. The integrated circuit of claim 2, wherein the conductive layer is formed at least in part of metal.

8. The integrated circuit of claim 2, further comprising:
   a second isolation buried layer formed under at least a portion of the second circuit section; and
   a second conductive layer formed on a surface of the integrated circuit and operatively coupled to the second isolation buried layer, the second conductive layer reducing an effective lateral resistance of the second isolation buried layer.

9. The integrated circuit of claim 8, further comprising:
   a plurality of conductive plugs formed in the substrate, the plugs providing a substantially low resistance path for electrically connecting the second conductive layer to the second isolation buried layer.

10. The integrated circuit of claim 8, wherein the second conductive layer comprises:

a plurality of conductive traces, the conductive traces intersecting with and connecting to one another to form a second net.

11. The integrated circuit of claim 10, wherein the second net includes a plurality of holes therein, wherein at least a portion of the second circuit section is formed in one or more holes in the second net.

12. The integrated circuit of claim 10, wherein the second net overlays at least a portion of the second circuit section.

13. The integrated circuit of claim 8, wherein the first and second conductive layers are electrically connected to separate ground or reference sources.

14. The integrated circuit of claim 8, wherein:

the second circuit section comprises at least one bipolar transistor device, the bipolar transistor device including a collector buried layer formed in the substrate above the second isolation buried layer.

15. The integrated circuit of claim 2, wherein:

the integrated circuit is a mixed signal integrated circuit;

the first circuit section comprises a digital circuit section; and the second circuit section comprises an analog circuit section.

16. The integrated circuit of claim 2, wherein the isolation buried layer has a lower resistivity than the substrate.

17. The integrated circuit of claim 2, wherein the isolation buried layer is formed in the substrate at depth in a range from about 2 micrometers ($\mu$m) to about 5 $\mu$m from an upper surface of the substrate.

18. An integrated circuit, comprising:

a first circuit section formed in a substrate;

a second circuit section formed in the substrate, the second circuit section being spaced laterally from the first circuit section;

a first isolation buried layer formed under at least a portion of the first circuit section;

a first conductive layer formed on a surface of the integrated circuit and operatively coupled to the isolation buried layer, the conductive layer reducing an effective lateral resistance of the first isolation buried layer;

a second isolation buried layer formed under at least a portion of the second circuit section; and a second conductive layer formed on a surface of the integrated circuit and operatively coupled to the second isolation buried layer, the second conductive layer reducing an effective lateral resistance of the second isolation buried layer;

wherein at least one of the first conductive layer and the second conductive layer comprises a plurality of conductive traces, the conductive traces intersecting with and connecting to one another to form a net.

* * * * *